US010534322B2

(12) United States Patent
Chu

(10) Patent No.: US 10,534,322 B2
(45) Date of Patent: Jan. 14, 2020

(54) USE OF RING OSCILLATORS FOR MULTI-STOP TIME MEASUREMENTS

(71) Applicant: Integrated Device Technology, Inc., San Jose, CA (US)

(72) Inventor: Min Chu, Milpitas, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 40 days.

(21) Appl. No.: 15/849,412

(22) Filed: Dec. 20, 2017

(65) Prior Publication Data

US 2019/0187628 A1 Jun. 20, 2019

(51) Int. Cl.
| | | |
|---|---|---|
| *G04F 10/00* | (2006.01) | |
| *H01J 49/40* | (2006.01) | |
| *H03K 3/03* | (2006.01) | |
| *H01J 49/00* | (2006.01) | |
| *H01J 49/02* | (2006.01) | |

(52) U.S. Cl.
CPC ........ *G04F 10/005* (2013.01); *H01J 49/0036* (2013.01); *H01J 49/40* (2013.01); *H01J 49/025* (2013.01); *H03K 3/0315* (2013.01)

(58) Field of Classification Search
CPC ..... G04F 10/005; H01J 49/0036; H01J 49/40; H03K 3/0315; H03K 3/0322; H03L 7/0995; H03L 7/0996
USPC .......................................................... 331/57
See application file for complete search history.

(56) References Cited

U.S. PATENT DOCUMENTS

| 8,138,843 | B2 | 3/2012 | Straayer et al. | |
|---|---|---|---|---|
| 8,390,349 | B1* | 3/2013 | Ravi | G04F 10/005 |
| | | | | 327/147 |
| 8,564,471 | B1* | 10/2013 | Gao | G04F 10/005 |
| | | | | 341/155 |
| 2007/0096836 | A1* | 5/2007 | Lee | G04F 10/005 |
| | | | | 331/57 |
| 2009/0273384 | A1* | 11/2009 | Kojima | H03K 5/131 |
| | | | | 327/262 |
| 2014/0320329 | A1* | 10/2014 | Dosho | G04F 10/005 |
| | | | | 341/166 |
| 2015/0077279 | A1* | 3/2015 | Song | G04F 10/005 |
| | | | | 341/155 |
| 2018/0045816 | A1* | 2/2018 | Jarosinski | G01S 7/4814 |
| 2018/0149753 | A1* | 5/2018 | Shin | G01S 17/89 |
| 2018/0351564 | A1* | 12/2018 | Lenzen | G04F 10/005 |
| 2019/0013820 | A1* | 1/2019 | Ohhata | H03M 1/365 |
| 2019/0064747 | A1* | 2/2019 | Sudo | G04F 10/005 |

OTHER PUBLICATIONS

Matthew Z. Straayer et al. "A Multi-Path Gated Ring Oscillator TDC With First-Order Noise Shaping," IEEE Journal of Solid-State Circuits, vol. 44, No. 4, Apr. 2009. 10 pages.
Shahrzad Naraghi, "Time-Based Analog to Digital Converters," A Dissertation Submitted in Partial Fulfillment of the Requirements for the Degree of Doctor of Philosophy (Electrical Engineering) in The University of Michigan, 2009. 118 pages.

(Continued)

*Primary Examiner* — Levi Gannon
(74) *Attorney, Agent, or Firm* — Haynes and Boone, LLP

(57) ABSTRACT

A multi-stop time-to-digital converter (TDC, 110) includes single-stop TDCs (510) connected to output nodes of a ring oscillator (504). Other features and embodiments are also provided.

19 Claims, 8 Drawing Sheets

(56) References Cited

OTHER PUBLICATIONS

Qi Zhong et al. "A High Precision TDC Based on a Multi-Phase Clock," School of Nuclear Science and Technology, Lanzhou University, Lanzhou 730000, China. 8 pages.

Jianjun Yu et al. "A 12-Bit Vernier Ring Time-to-Digital Converter in 0.13 um CMOS Technology," IEEE Journal of Solid-State Circuits, vol. 45, No. 4, Apr. 2010. 13 pages.

S. Henzler, "Time-to-Digital Converters," Springer Series in Advanced Microelectronics 29; Chapter 2: Time-to-Digital Converter Basics, Springer Science + Business Media B.V. 2010. 15 pages.

* cited by examiner

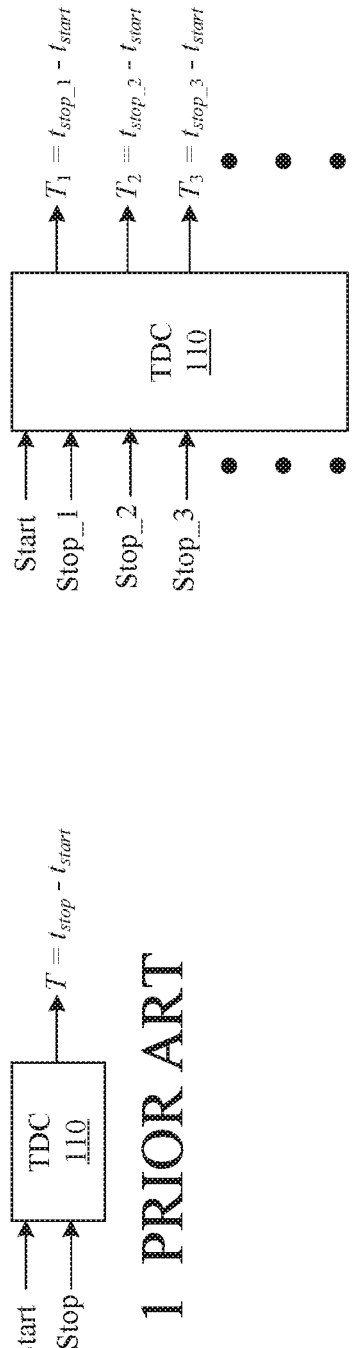

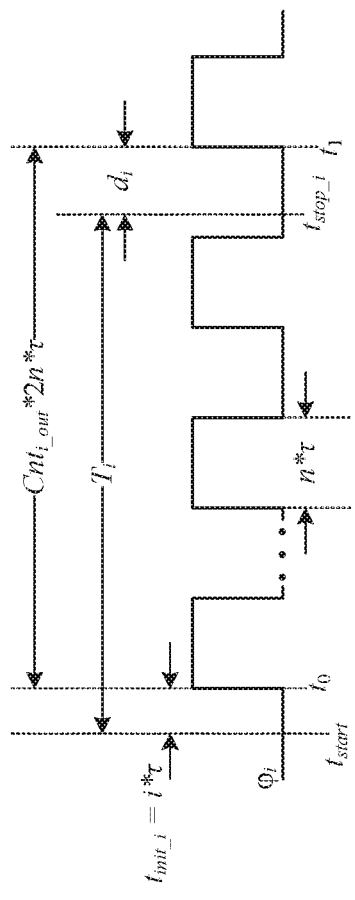
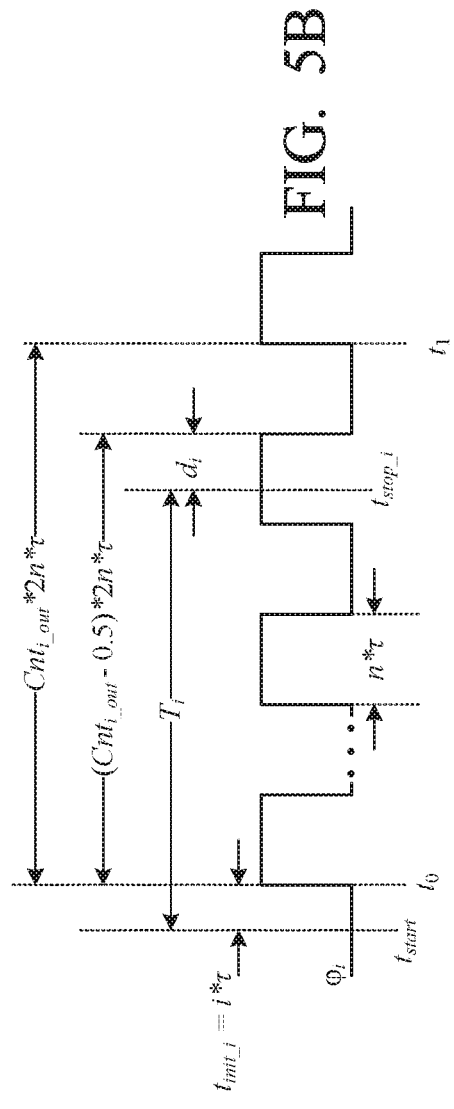

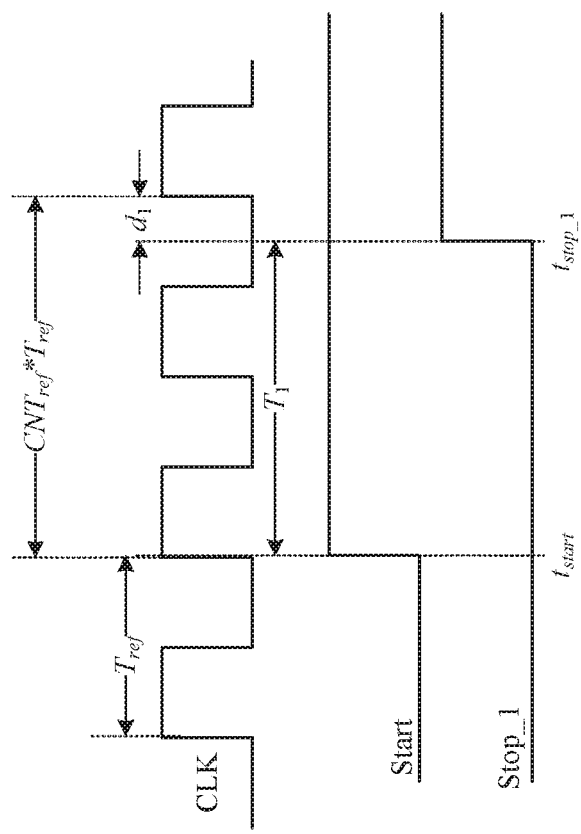

US 10,534,322 B2

USE OF RING OSCILLATORS FOR MULTI-STOP TIME MEASUREMENTS

BACKGROUND OF THE INVENTION

The present invention relates to automatic time-based measurements, e.g. Time of Flight (TOF) measurements or other time-related measurements, such as performed by LIDARs (light detection and ranging devices), robots, self-driving cars, drones, phase-locked loops, mass spectrometers, and other automated equipment.

Time-based measurements are widely used to measure distances, signal phase differences, and masses. For example, a robot can determine the distance to an object by emitting a light beam and measuring the time traveled by the light to the object and back. A phase-locked loop (PLL) can determine the phase difference between two signals by measuring the time interval between the signals crossing a threshold value. A mass spectrometer can determine composition of a sample by measuring the time that it takes a sample's ionized molecules to travel a predetermined distance in an electric field.

FIG. 1 illustrates a time measurement device 110, called "time-to-digital converter" (TDC). TDC 110 accepts a Start signal and a Stop signal. The Start signal is asserted at some time $t_{start}$ when the measured time begins, e.g. when a robot emits a light beam. The Stop signal is asserted at a later time $t_{stop}$ when the measured time ends, e.g. the robot detects the reflected light. TDC 110 outputs a digital signal $$T = t_{stop} - t_{start}$$

which represents the duration being measured.

A multi-stop TDC 110 (FIG. 2) determines durations of multiple events, all of which start at a time $t_{start}$. Different events end at possibly different times $t_{stop\_1}$, $t_{stop\_2}$, etc., as indicated by signals Stop_1, Stop_2, etc. For each event j, the TDC outputs the digital signal $T_j = t_{stop\_j} - t_{start}$ representing the event duration.

The multi-stop TDC can be implemented as a number of single-stop TDCs Each single-stop TDC could accept the Start signal and a corresponding Stop signal Stop_j, and provide the digital $T_j$ signal. However, a smaller and simpler multi-stop TDC is desired.

SUMMARY

This section summarizes some features of the invention. Other features may be described in the subsequent sections. The invention is defined by the appended claims, which are incorporated into this section by reference.

In some embodiments of the present invention, a multi-stop TDC includes single-stop TDCs sharing a ring oscillator. The single-stop TDCs measure the time intervals starting at different tap nodes of the ring oscillator. The delay measured by each single-stop TDC is reduced, thus making the TDC circuit simpler, smaller, lower in cost, and more precise.

In some embodiments, at least some of the delays are measured relative one of the Stop_i signals, not the Start signal. The measured delays are further reduced as a result.

In some embodiments, each single-stop TDC can be a two-step TDC.

The invention is not limited to the features or advantages discussed above, except as defined by the appended claims.

BRIEF DESCRIPTION OF THE DRAWINGS

FIGS. 1 and 2 are block diagrams of prior art TDCs.

FIGS. 5A and 5B are timing diagrams for some embodiments of the TDC of FIG. 3.

FIGS. 9A, 9B, 10A, 10B are timing diagrams for some embodiments of the TDC of FIGS. 7 and 8.

DESCRIPTION OF SOME EMBODIMENTS

The embodiments described in this section illustrate but do not limit the invention. The invention is defined by the appended claims.

Figure 3:
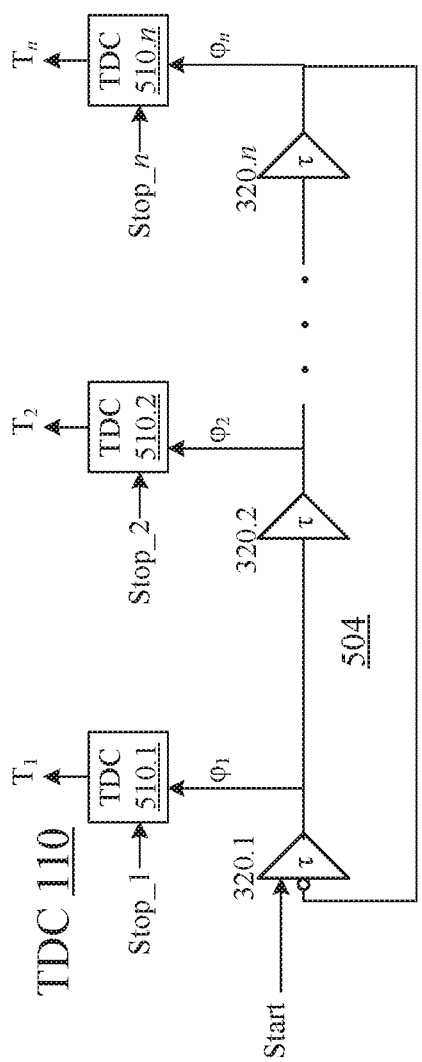
FIG. 3 is a block diagram of a multi-stop TDC according to some embodiments of the present invention.
Figure 4:
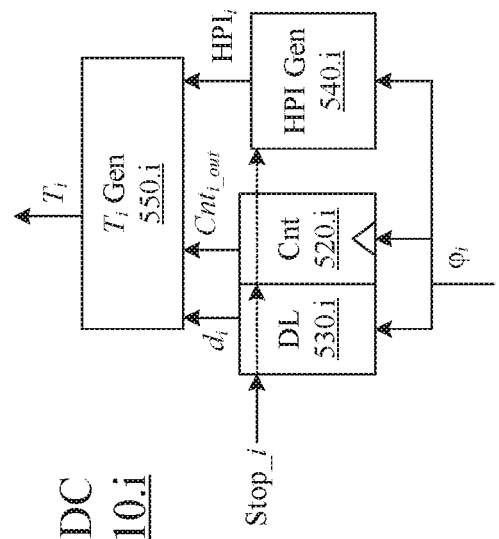
FIG. 4 is a block diagram of a single-stop TDC used in some embodiments of the multi-stop TDC of FIG. 3.

FIGS. 3 and 4 show an example multi-stop TDC 110 according to some embodiments of the present invention. FIGS. 5A, 5B are timing diagrams. TDC 110 includes a ring oscillator 504 of n serially connected buffers 320.1, 320.2, . . . , 320.n.

Ring oscillator use in conventional TDCs has been described in one or more of the following documents, all of which are incorporated herein by reference:

- J. Yu, F. F. Dai, and R. C. Jaeger, "A 12-Bit Vernier Ring Time-to-Digital Converter in 0.13 um CMOS Technology," IEEE J. Solid-State Circuits, vol. 45, no. 4, Apr. 2010;
- M. Z. Straayer and M. H. Perrott, "A Multi-Path Gated Ring Oscillator TDC With First-Order Noise Shaping," IEEE J. Solid-State Circuits, vol. 44, no. 4, April 2009;
- Shahrzad Naraghi, "Time-Based Analog to Digital Converters", dissertation submitted in partial fulfillment of the requirements for the degree of Doctor of Philosophy (Electrical Engineering), University of Michigan, 2009, available at https://deepblue.lib.umich.edu/bitstream/handle/2027.42/64787/naraghi_1.pdf?sequence=1.

In FIG. 3, each buffer 320.i is a non-inverting buffer. The output of one of the buffers 320 (of the last buffer 320.n in FIG. 3) is inverted and connected to the input of buffer 320.1 to cause each buffer output $\varphi_i$ to oscillate. An oscillator cycle duration is n*τ, where τ is each buffer's delay. Each $\varphi_i$ signal has a period of 2n*τ.

TDC 110 can accept up to n stop signals Stop_1 through Stop_n. Each stop signal Stop_i is provided to an input of a corresponding TDC 510.i connected to the output $\varphi_i$ of corresponding buffer 320.i In some embodiments, the number of Stop signals may differ from the number of buffers 320, and any TDC 510.i can be connected to any output $\varphi_j$. Further, any buffer output $\varphi_j$ can be connected to multiple TDCs 510 or to none at all. However, it may be desirable to distribute the TDCs 510 evenly among the $\varphi_j$ nodes to equalize the buffer 320 output capacitances and hence the buffer delays, as in FIG. 3.

Buffer 320.1 accepts the Start signal, which propagates through the ring oscillator's nodes $\varphi_i$.

For ease of description of some embodiments, signals will be assumed to be asserted on a rising edge, and deasserted by a falling edge, unless made clear otherwise. But the invention is not limited to rising or falling edge signal assertion or deassertion.

Each TDC 510.*i* generates the corresponding digital value $T_i$ representing the duration from the assertion of Start to assertion of Stop_i:

$$T_i = t_{stop\_i} - t_{start}$$

In some embodiments, each TDC 510 is a single-stop TDC, possibly of conventional design.

FIG. 4 shows a TDC 510.*i* implementation that can be used for some or all of TDCs 510 of FIG. 3. TDC 510.*i* of FIG. 4 is a two-step TDC, which includes a counter 520.*i* and a delay line 530.*i*. Counter 520.*i* counts the rising edges of the corresponding buffer output signal $\varphi_i$. The $\varphi_i$ timing diagrams are shown in FIGS. 5A, 5B. A $\varphi_i$ rising edge occurs every two oscillator cycles, so the counter is incremented with period $2n^*\tau$. The counter is initialized to 0 (e.g. by asserting the Start signal, or by deasserting the Start signal before the current time measurement).

The counter starts counting on the next rising edge of $\varphi_i$ after asserting the Start signal. In some embodiments, before the Start signal is asserted, the input to buffer 320.1 is initialized to a low voltage. The Start assertion, at time $t_{start}$, causes the buffer 320.1 input to rise to the high voltage. This rising edge reaches the $\varphi_i$ node at time $t_{start} + i^*\tau$, shown as $t_0$ in FIGS. 5A and 5B, and the counter starts counting at this time. Since the counter starts counting at the beginning of the first $\varphi_i$ cycle, the counter's output signal $Cnt_{i\_out}$ represents a value that is one greater than the number of $\varphi_i$ cycles.

Counter 520.*i* is disabled by the Stop_i signal, i.e. at the end of $T_i$. At this time, the counter's output signal $Cnt_{i\_out}$ represents a value that is one greater than the whole number of $\varphi_i$ cycles from the first rising edge of $\varphi_i$ until $t_{stop\_i}$. To put it differently, signal $Cnt_{i\_out}$ represents the whole number of $\varphi_i$ cycles up to the first rising edge of $\varphi_i$ after $t_{stop\_i}$. The first rising edge is shown at $t_1$ in FIGS. 5A and 5B.

The corresponding number of oscillator cycles is $2Cnt_{i\_out}$; the corresponding time is $2Cnt_{i\_out}*n\tau$, as marked in FIGS. 5A and 5B ($Cnt_{i\_out}$=3 at time $t_{stop\_i}$ in the example of FIGS. 5A and 5B).

In FIGS. 5A and 5B, the symbol $t_{init\_i}$ denotes the value $i^*\tau$.

Delay line 530.*i* is enabled by the Stop_i signal. DL 530.*i* generates the digital signal $d_i$ representing the time from $t_{stop\_i}$ to the next (rising or falling) $\varphi_i$ edge. The time between the adjacent $\varphi_i$ edges is $n^*\tau$. This value is an upper bound of the time that may have to be measured by the delay line.

Circuit 550.*i* performs digital arithmetic to generate the $T_i$ value as illustrated in FIGS. 5A and 5B. The two figures are similar, but in FIG. 5A the signal Stop_i is asserted when $\varphi_i$ is low voltage; and in FIG. 5B, Stop_i is asserted when $\varphi_i$ is high.

In the case of FIG. 5A, $$T_i = i^*\tau + Cnt_{i\_out}*2n\tau - d_i \quad (1)$$

In the case of FIG. 5B, $$T_i = i^*\tau + (Cnt_{i\_out} - 0.5)*2n\pi d_i \quad (2)$$

Circuit 550.*i* determines the $\varphi_i$ value at the time $t_{stop\_i}$, and applies the equation (1) or (2) to obtain the $T_i$ value.

In some embodiments, the $\varphi_i$ value at time $t_{stop\_i}$ is provided to circuit 550.*i* by circuit 540.*i* (FIG. 4), called High Pulse Indicator or HPI. Circuit 540.*i* accepts Stop_i and $\varphi_i$ and generates a digital signal $HPI_i$ representing the $\varphi_i$ value at the time $t_{stop\_i}$ for the circuit 550.*i*.

Figure 6:
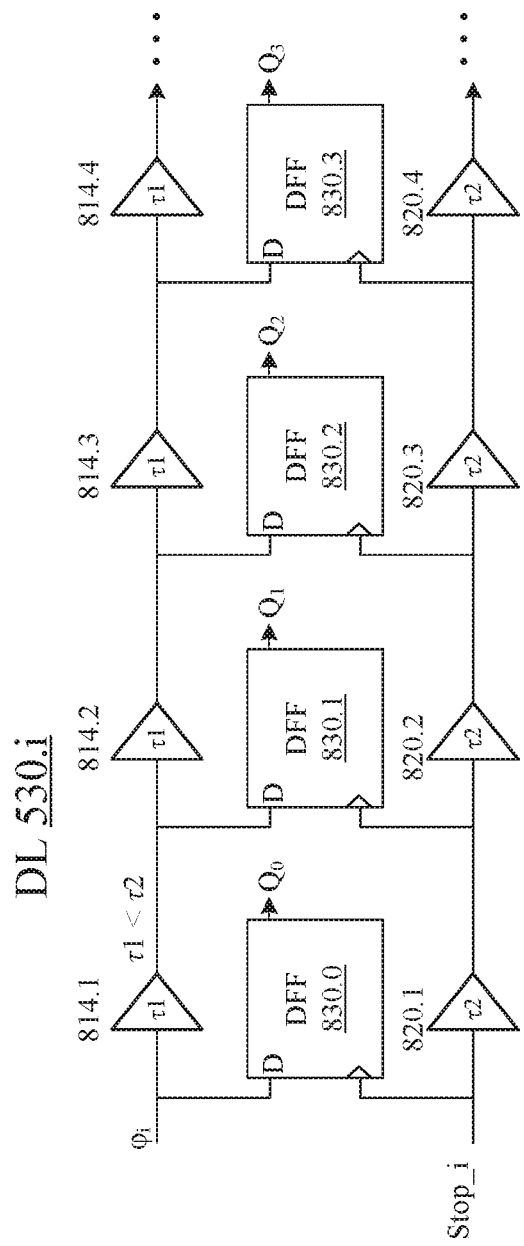
FIG. 6 is a block diagram of a Vernier delay line used in some embodiments of the single-stop TDC of FIG. 4.

Delay line 530.*i* has a higher resolution than $n^*\tau$, enabling the $d_i$ signal to represent smaller intervals than $n^*\tau$ or even smaller than $\tau$. Many implementations of the delay line are possible, including conventional implementations. FIG. 6 shows a Vernier delay line implementation. Vernier delay line 530.*i* includes two chains of serially connected buffers. Buffer chain 814 receives signal $\varphi_i$ (at the input of the first buffer 814.1). Buffer chain 820 receives Stop_i (at the input of the first buffer 820.1). Each buffer 814.*j* has a propagation delay $\tau 1$, which is smaller than the delay $\tau 2$ of each buffer 820.*j*.

The output of each buffer 814.*j* is connected to the data input D of corresponding data flip flop 830.*j*, whose clock input is connected to the output of corresponding buffer 820.*j*. Also, the signals $\varphi_i$ and Stop_i are provided, respectively, to the data and clock inputs of a data flip flop 830.0. Each flip flop 830.*j* passes the signal on the D input to its Q output $Q_j$ on the rising edge of the flip flop's clock input.

The $\varphi_i$ transitions propagate along the chain 814, but are not latched by flip flops 830 until the rising edge of Stop_i. Stop_i assertion begins the $d_i$ period (FIGS. 5A, 5B). The Stop_i rising edge then propagates along the chain 820. During this time, the $\varphi_i$ values on buffer 814 outputs are latched by flop flops 830. Since $\tau 1$ is smaller than $\tau 2$, the $\varphi_i$ signal propagates faster, so the latched $\varphi_i$ values represent the $\varphi_i$ level at the time $t_{stop\_i}$, when Stop_i was asserted.

When $\varphi_i$ transitions to a new level (at the end of time interval $d_i$), the new $\varphi_i$ level propagates and eventually catches up with Stop_i because $\tau 1$ is smaller than $\tau 2$. However, Stop_i remains high, so the new $\varphi_i$ value is not latched until this value overtakes the rising edge of Stop_i propagating along the chain 820. The new $\varphi_i$ value becomes latched only by those flip flops 830 which are reached by the Stop_i rising edge before the new $\varphi_i$ value. As a result, the $Q_j$ outputs form a temperature code for the time difference $d_i$ from the Stop_i assertion to the next edge of $\varphi_i$. The delay $d_i$ is thus:

$$d_i = k_i *(\tau 2 - \tau 1) \quad (3)$$

where $k_i$ is the number represented by the temperature code on the $Q_j$ outputs.

The $d_i$ resolution is the difference $\tau 2 - \tau 1$, which can be small even if $\tau 1$ and $\tau 2$ are large. The difference can be smaller than $\tau 1$ by a factor of 10 or more.

In some embodiments, $\tau 1 = \tau$ (FIG. 3).

In some TDC embodiments, delays are measured relative to a stop signal. Measurement of long time durations is facilitated.

Figure 7:
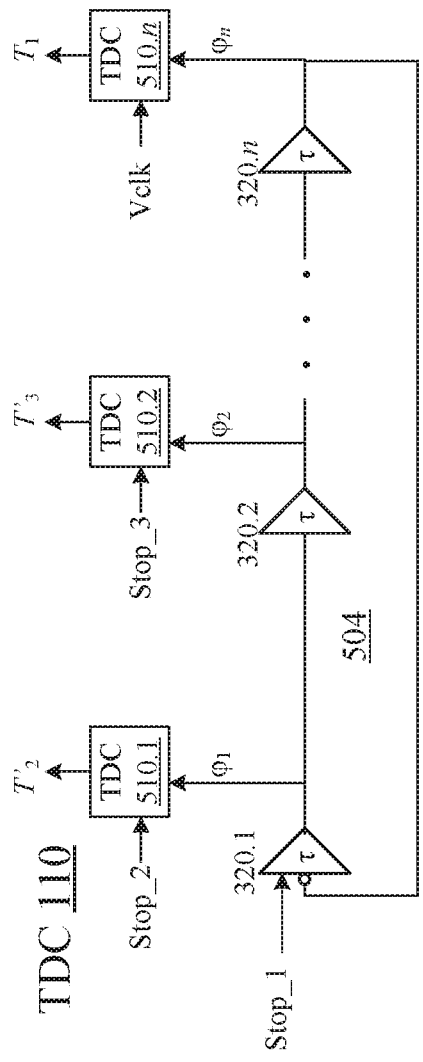
FIGS. 7 and 8 are block diagrams of circuits used to implement a multi-stop TDC according to some embodiments of the present invention.

FIG. 7 illustrates such a TDC 110. This TDC is similar to that of FIG. 3, but ring oscillator 504 is enabled by the Stop_1 signal rather than Start. TDC 110 includes n single-stop TDCs 510.1, ..., 510.*n*, connected to respective nodes $\varphi_i$, (p, but any number of TDCs 510 is possible, and they can be connected to any $\varphi_i$ nodes. In the example of FIG. 7, TDC 510.1 accepts the signal Stop_2 rather than Stop_1 as in FIG. 3, and generates a digital signal representing the duration $T'_2 = T_2 - T_1$. Likewise, each TDC 510.*i* accepts the signal Stop_(i+1) and generates a digital signal representing the duration $T'_{i+1} = T_{i+1} - T_1$. The $T'_i$ values are generated as in equations (1), (2), (3).

An arithmetic circuit (not shown, possibly a microprocessor, possibly the same circuit for all i) adds $T_1$ to each $T'_{i+1}$ to generate $T_{i+1}$.

Figure 8:
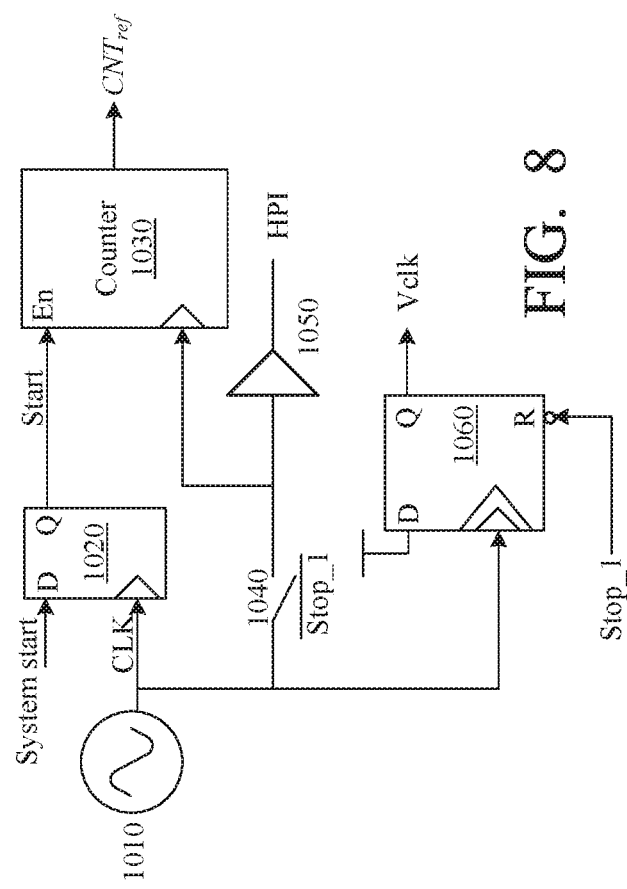

TDC 510.*n* generates $T_1$ by a method similar to the embodiment of FIGS. 3-6, but using a separate clock CLK instead of $\varphi_1$. FIG. 8 illustrates circuitry, additional to TDC 510.*n*, for $T_1$ generation. Oscillator 1010 generates the clock signal CLK. Clock CLK can be of much lower frequency than oscillator 504. For example, the CLK frequency can be 25 MHz, when ring oscillator 504 frequency is 500 MHz. (These values are exemplary and not limiting.) In the timing diagrams of FIGS. 9A and 9B, the CLK period is marked as $T_{ref}$.

In some embodiments, if CLK is of low frequency, oscillator 1010 can be a highly precise circuit, e.g. a crystal oscillator. High precision is especially desirable for $T_1$ generation because $T_1$ is measured relative to $t_{start}$ and therefore can be a long duration.

The CLK signal is provided to the clock input of data flip flop 1020, whose data input D receives a System Start signal. The Q output of flip flop 1020 provides the Start signal, and is connected to the Enable input of binary counter 1030. When the counter is enabled (at time $t_{start}$, on a rising edge of CLK), the counter counts the rising edges on the counter's clock input.

The counter's clock input is connected to the CLK output of oscillator 1010 through switch 1040, which is controlled by the inverse of Stop_1. When Start is asserted (at time $t_{start}$), Stop_1 is still low, so switch 1040 is closed. Counter 1030 counts the CLK rising edges starting with zero, providing the count on output $CNT_{ref}$.

When Stop_1 becomes asserted, the counter's clock input becomes disconnected from the CLK signal by switch 1040, and the counting stops. At this time, the counter output $CNT_{ref}$ represents the number of CLK cycles from the Start assertion to the first rising CLK edge after Stop_1 assertion. The corresponding time interval is $CNT_{ref}*T_{ref}$ as marked in FIGS. 9A and 9B ($CNT_{ref}=2$ in the example of FIG. 9A, $CNT_{ref}=3$ in the example of FIG. 9B).

Figure 9B:
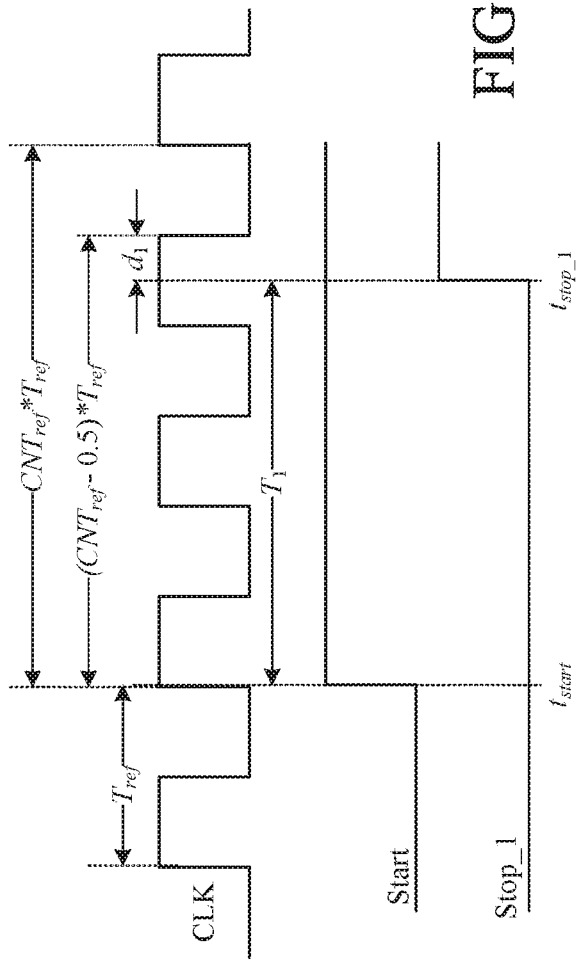

FIGS. 9A and 9B are similar to each other, but in FIG. 9A, the signal Stop_1 is asserted when CLK is low voltage; and in FIG. 9B, Stop_1 is asserted when CLK is high.

The time from $t_{stop\_1}$ to the next CLK edge (rising or falling) is shown as $d_1$ in FIGS. 9A and 9B.

TDC 510.$n$ determines $d_1$ as described below, and determines $T_1$ similarly to equations (1) and (2), i.e.:

In the case of FIG. 9A, $$T_1 = CNT_{ref}*T_{ref}-d_1 \quad (4)$$

In the case of FIG. 9B, $$T_1 = (CNT_{ref}0.5)*T_{ref}-d_1 \quad (5)$$

In some embodiments, the CLK value at time $t_{stop\_1}$ is provided to TDC 510.$n$ by High Pulse Indicator (HPI) circuit 1050 of FIG. 8. HPI circuit 1050 can be a buffer whose input is connected to the CLK output of oscillator 1010 through switch 1040. Circuit 1050 generates the output signal HPI representing the CLK level, and holds its output HPI constant when the switch 1040 is open.

TDC 510.$n$ samples the HPI signal, and operates according to the equation (4) or (5) depending on the HPI signal.

Figure 10B:
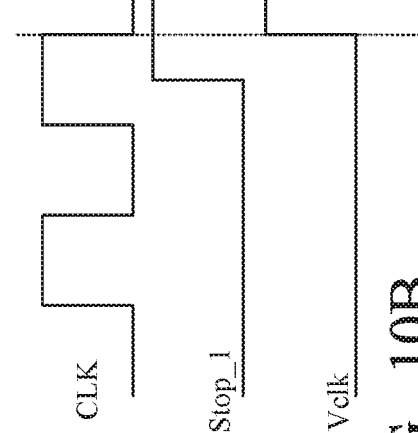
Figure 10A:
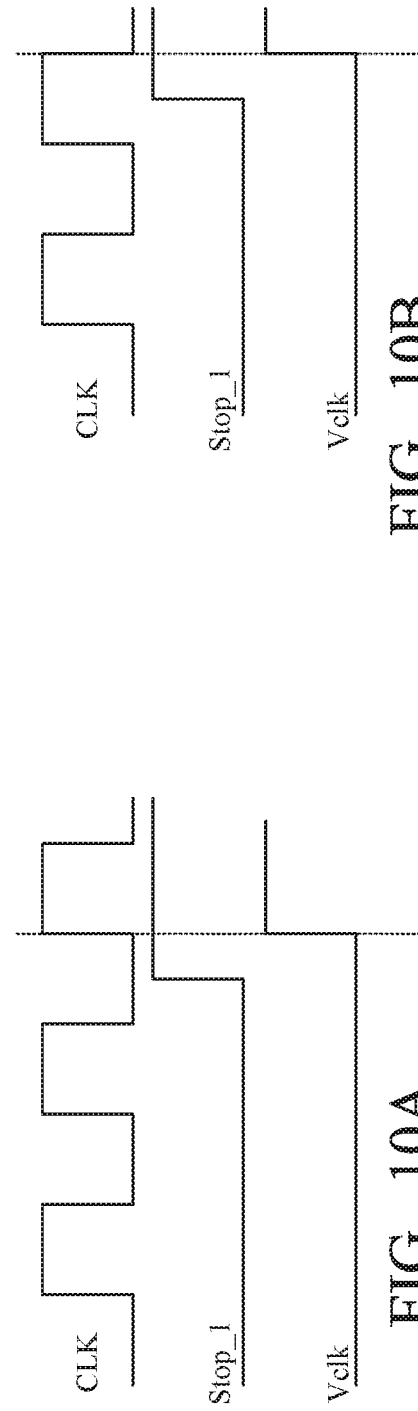

TDC 510.$n$ determines $d_1$ using a signal Vclk generated by dual-edge flip flop 1060 on its Q output. Flip flop 1060 is a Set/Reset flip flop triggered on every edge, rising or falling, on its clock input. The clock input receives CLK. The flip flop's data input D receives the high voltage. The Reset input receives the inverted Stop_1 signal. When Stop_1 is deasserted, the Vclk signal is low voltage. When Stop_1 is asserted, the Vclk signal becomes high on the next edge (rising or falling) of the CLK input of flip flop 1060. See FIG. 10A (Stop_1 is asserted when CLK is low) and 10B (Stop_1 is asserted when CLK is high).

TDC Calibration: Because a free-running ring oscillator 504 may include many stages, and may run for a long time, large timing errors are possible in the presence of even small deviations of buffer 320 delays from their ideal value τ. One way to avoid these errors is to lock the ring oscillator to a phase locked loop (PLL). For example, the input to any given buffer 320.$i$ can be adjusted (e.g. delayed) by a PLL. However, this increases the TDC size, cost and complexity. In some embodiments, proper calibration allows avoiding the PLL solution.

Multi-stop TDC calibration can be performed by tying together the Stop_i inputs, effectively making the TDC single-stop for calibration. Then all the $T_i$ outputs must ideally be the same value "$t_{calibrate}$":

$$t_{calibrate}=T_i=t_{stop\_i}-t_{start} \text{ for all } i \quad (6)$$

The value $T_i$ can be expressed in terms of τ, τ1, and τ2 for each i. For example, for the embodiment of FIGS. 3-6, equations (1), (2), and (3) provide for each i:

$$t_{calibrate}=i*\tau(Cnt_{i\_out}-HPI_i)*2n\tau-k_i*(\tau2-\tau1) \quad (7)$$

where:

HPI$_i$=0 if the Stop signal (the common Stop_i signal) was asserted when $\varphi_i$ was high; and HPI$_i$=0.5 if Stop was asserted when $\varphi_i$ was low.

Equation (7) results in n equations for i=1, 2, . . . , n. These equations have two unknowns: τ and (τ2−τ1). Any two of the equations can be solved for the unknowns. Or all possible equation pairs can be solved for the two unknowns, and the resulting solutions can be averaged to achieve the final answer for τ and (τ2−τ1).

Then the digital circuits performing digital computations according to equations (1), (2), and (3) can be programmed to use the final answer for τ and (τ2−τ1).

Similar calibration can be done for the embodiment of FIGS. 7 and 8, and for other embodiments.

Figure 11:
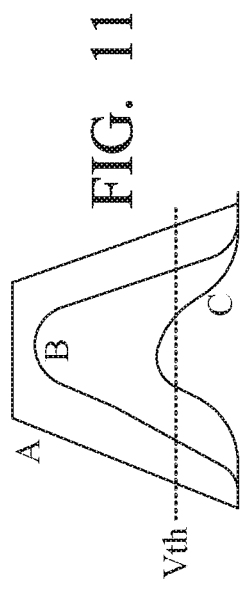
FIG. 11 is a timing diagram of a voltage signal obtained in some embodiments of the present invention.
Figure 12:
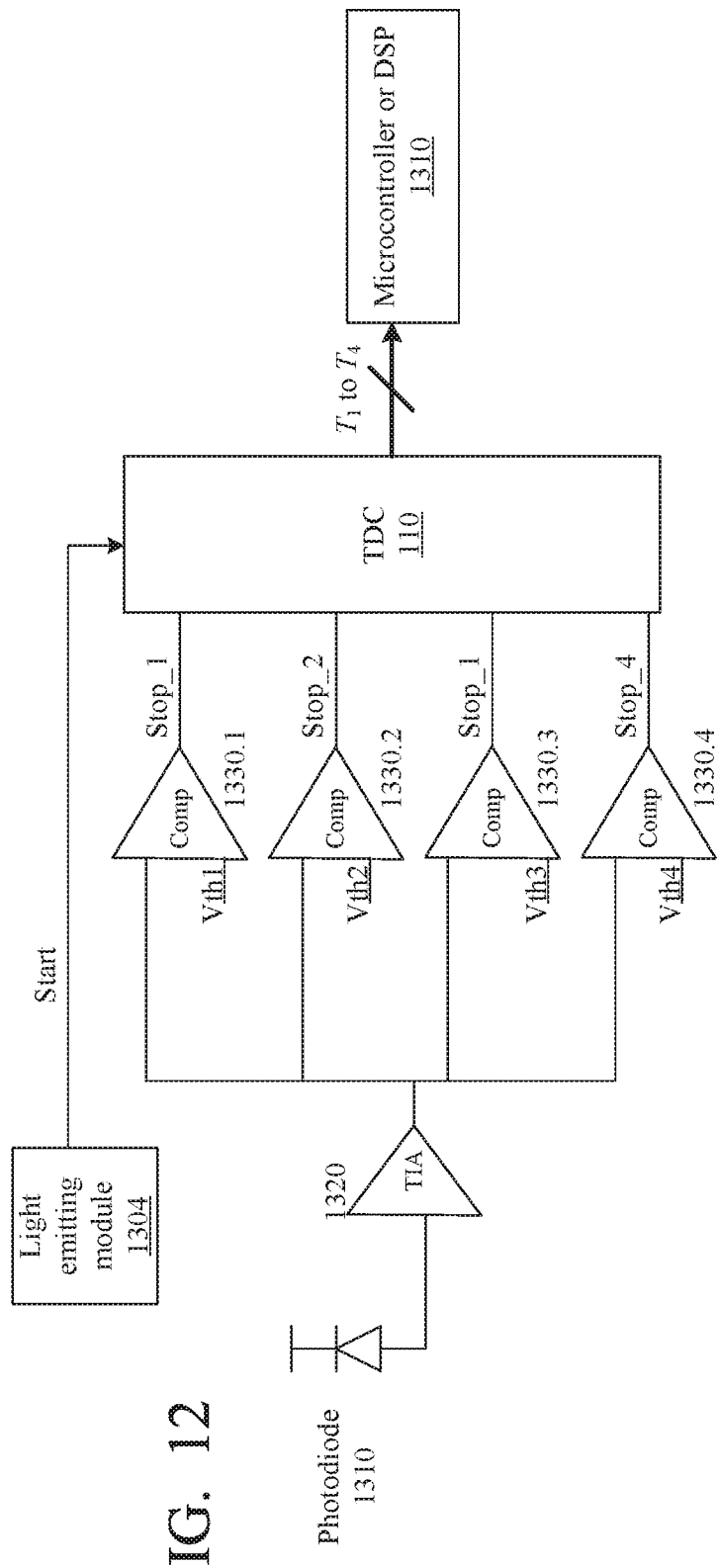
FIG. 12 is a block diagram of a multi-stop TDC according to some embodiments of the present invention.

FIGS. 11 and 12 illustrate a possible multi-stop TDC application. As noted above, a TDC is a key component in high-performance digital phase-locked loops (DPLL) and time of flight (TOF) applications. Multi-stop capability can be used in TOF systems as illustrated in FIG. 12. A light emitting module 1304 generates the Start signal for TDC 110, and emits a light beam (possibly a laser beam, possibly using a laser diode) towards an object (not shown). Reflected light is detected by a photodiode 1310, which generates electric current proportional to the light intensity. The current is amplified and converted to a voltage by transimpedance amplifier (TIA) 1320.

FIG. 11 illustrates possible voltage profiles output by TIA 1320. In single-stop applications, the TIA output voltage is thresholded to obtain a Stop signal, i.e. the Stop signal is asserted when this voltage crosses some predefined threshold Vth. However, the voltage profile depends on the reflected light, which in turn depends on the type of the reflecting material and environmental factors. The voltage waveform may look like any of the waveforms A, B or C. If Vth is chosen a very low value, then the TOF system will react to ambient light variations, and the TOF output duration may be too short. If Vth is too high, it may never be reached by the reflected signal, and the TOF output duration may be too high.

Therefore, some embodiments use multiple voltage thresholds Vth1, Vth2, etc., to generate multiple Stop signals Stop_1, Stop_2, etc. for the respective thresholds. FIG. 12 shows four thresholds Vth1, Vth2, Vth3, Vth4. The TIA output voltage is provided to four comparators 1330. Each comparator 1330.$i$ compares the output voltage with a respective threshold, and generates a respective output signal Stop_i. The Stop_i signals are provided to a multi-stop TDC 110, which also receives the Start signal and generates the time values $T_i$ representing the duration to the time when the TIA output voltage crosses the respective threshold. The $T_i$ outputs can be provided to microcontroller or digital signal processor 1310, or to other circuitry, for further processing. For example, if one of the $T_i$ outputs, e.g. $T_4$, is too long, and another $T_i$ is too short, the microcontroller may pick some other $T_i$ which lies in a reasonable expected range, and provide output as the true time of flight.

Some embodiments discussed above have the following advantages. The ring oscillator can support any number of single-stop TDCs 510 (FIG. 3 or 7), with an arbitrary number of stops Stop_i. If the TDCs 510 are evenly distributed among the $\varphi_i$ nodes, with one TDC 510 per node, then n stops can be supported. If buffers 320 are differential buffers, then 2n stops can be supported. (Each buffer 320 can be inverting or non-inverting.)

The Vernier line implementation of TDC 510 (FIG. 6) can achieve arbitrarily fine resolution regardless of process technology.

If a two-step TDC is used (FIG. 7), then the ring oscillator 504 is only used to measure the durations $T'_i$, which are shorter than one CLK cycle. This limits the inaccuracy accumulation of the ring oscillator to less than one CLK cycle.

The invention is not limited to the embodiments and advantages described above. Some embodiments are defined by the following numbered clauses.

1. An apparatus comprising a circuit for measuring event durations, the circuit comprising:
  a ring oscillator (e.g. 504) comprising an input node for receiving an input signal (e.g. Start or Stop_i) responsive to a start or end of at least one of a plurality of events, the ring oscillator comprising a plurality of output nodes (e.g. $\varphi_i$), the ring oscillator being responsive to the input signal to provide, on each output node, one or more delayed signals each of which is delayed relative to the input signal;
  a plurality of time-to-digital converters (TDCs; for example, each TDC can be 510.i with or without counter 520.i and/or other circuitry, possibly including a microprocessor, latches for latching input or output signals, etc.), each TDC having an input node for receiving a respective stop signal indicating an end of a respective one of said events, each TDC being connected to one of the ring oscillator's output nodes, each TDC comprising an output for providing a digital signal (e.g. $T_i$ or $T'_i$) having a predetermined relationship to the respective stop signal.

2. The apparatus of clause 1 wherein the ring oscillator's input signal indicates a start of each of the plurality of events.

3. The apparatus of clause 1 wherein the ring oscillator's input signal is a first stop signal which indicates an end of a first event which is one of the events, and the circuit further comprises a first TDC for determining a duration of the first event.

4. The apparatus of clause 3 wherein the first TDC comprises:
  a counter for counting clock cycles of a clock signal and generating a clock cycle count which depends on the first event's duration; and
  a second TDC for determining a duration between (a) the first stop signal's indication of the end of the first even, and (2) a time referenced to the clock cycle count provided by the counter.

5. The apparatus of clause 4 wherein the maximum duration measured by the second TDC does not exceed a period of the clock cycles.

6. The apparatus of clause 4 wherein for each output node of the ring oscillator, at least one delay operable to be provided at the output node is shorter than a period of the clock cycles.

7. The apparatus of any one of clauses 1 to 6 wherein an oscillation period of the ring oscillator is shorter than a period of the clock cycles.

8. The apparatus of any one of clauses 1 to 7 wherein each TDC comprises a Vernier delay line.

9. The apparatus of any preceding clause wherein the duration of at least one of the events corresponds to a duration of travel of a light beam from a light emitter of the apparatus to a light detector of the apparatus.

10. The apparatus of clause 9 wherein the duration of said at least one of the events is a duration from emitting the light beam to crossing a predefined threshold by a signal generated from light detected by the light detector. (For example the generated signal can be an electrical signal as in FIG. 11, or light signal (such as used in optical computing).

11. The apparatus of any preceding clause wherein the duration of at least one of the events corresponds to a phase difference between two signals.

12. An apparatus comprising a circuit for measuring event durations, the circuit comprising:
  a ring oscillator comprising a plurality of serially connected buffers (e.g. 320) with equal propagation delays, each buffer having an output node;
  a plurality of time-to-digital converters (TDCs), each TDC being for determining a duration between assertions of signals on two input nodes of the TDC, one of the TDC's input nodes being connected to one of the output nodes.

13. The apparatus of clause 12 wherein for each TDC, one of the TDC's input nodes is connected to receive a respective stop signal indicating an end of an associated event, different TDCs being associated with different events.

14. The apparatus of clause 12 or 13, wherein the ring oscillator is connected to receive an input signal asserted at a start of each of a plurality of events.

15. The apparatus of clause 12 or 13, wherein the ring oscillator is connected to receive a first stop signal which indicates an end of a first event which is one of a plurality of events, and the circuit further comprises a first TDC for determining a duration of the first event.

16. The apparatus of any preceding clause wherein the duration determined by at least one of the TDCs corresponds to a duration of travel of a light beam from a light emitter of the apparatus to a light detector of the apparatus.

17. The apparatus of clause 16 wherein the duration determined by said at least one of the TDCs is a duration from emitting the light beam to crossing a predefined threshold by a signal generated from light detected by the light detector.

18. A method for measuring a distance to an object, the method comprising:
  emitting a light beam towards the object;
  generating a start signal, and asserting the start signal to indicate a start time when the light beam is emitted to the object;
  detecting light which comprises light reflected by the object;
  generating a plurality of electrical stop signals corresponding to a plurality of thresholds associated with the detected light, each stop signal being asserted in response to an associated threshold being reached;
  providing the start signal or one of the stop signals to an input node of a ring oscillator, the ring oscillator comprising a plurality of output nodes, the ring oscillator providing, on each output node, one or more delayed signals each of which is delayed relative to the signal provided to the input node;

for each stop signal not provided to the input node, generating a duration signal corresponding to a duration between an assertion of the stop signal and an assertion of an associated one of the delayed signals.

19. The method of clause 18 wherein:

the signal provided to the input node of the ring oscillator is a first stop signal which is one of the stop signals; and the method further comprises determining a duration between an assertion of the start signal and an assertion of the first stop signal.

20. The method of clause 19 wherein the duration between an assertion of the start signal and an assertion of the first stop signal is determined using a two-step TDC comprising a counter for counting a number of clock cycles and comprising a TDC for determining a duration between the assertion of the first signal and a time interval obtained using the counter.

Other embodiments are within the scope of the invention, as defined by the appended claims.

The invention claimed is:

1. An apparatus comprising a circuit for measuring event durations, the circuit comprising:
   a ring oscillator comprising an input node for receiving an input signal responsive to a start or end of at least one of a plurality of events, the ring oscillator comprising a plurality of output nodes, the ring oscillator being responsive to the input signal to provide, on each output node, one or more delayed signals each of which is delayed relative to the input signal;
   a plurality of time-to-digital converters (TDCs), each TDC having an input node for receiving a respective stop signal indicating an end of a respective one of said events, each TDC being connected to a respective one of the ring oscillator's output nodes but not to any other one of the ring oscillator's output nodes, at least two of the TDCs being connected to the respective different ones of the output nodes, each TDC comprising an output for providing a digital signal having a predetermined relationship to the respective stop signal.

2. The apparatus of claim 1 wherein the ring oscillator's input signal indicates a start of each of the plurality of events.

3. The apparatus of claim 1 wherein each TDC comprises a Vernier delay line.

4. The apparatus of claim 1 wherein the duration of at least one of the events corresponds to a duration of travel of a light beam from a light emitter of the apparatus to a light detector of the apparatus.

5. The apparatus of claim 4 wherein the duration of said at least one of the events is a duration from emitting the light beam to crossing a predefined threshold by a signal generated from light detected by the light detector.

6. The apparatus of claim 1 wherein the duration of at least one of the events corresponds to a phase difference between two signals.

7. An apparatus comprising a circuit for measuring event durations, the circuit comprising:
   a ring oscillator comprising an input node for receiving an input signal responsive to a start or end of at least one of a plurality of events, the ring oscillator comprising a plurality of output nodes, the ring oscillator being responsive to the input signal to provide, on each output node, one or more delayed signals each of which is delayed relative to the input signal;
   a plurality of time-to-digital converters (TDCs), each TDC having an input node for receiving a respective stop signal indicating an end of a respective one of said events, each TDC being connected to one of the ring oscillator's output nodes, each TDC comprising an output for providing a digital signal having a predetermined relationship to the respective stop signal;
   wherein the ring oscillator's input signal is a first stop signal which indicates an end of a first event which is one of the events, and the circuit further comprises a first TDC for determining a duration of the first event.

8. The apparatus of claim 7 wherein the first TDC comprises:
   a counter for counting clock cycles of a clock signal and generating a clock cycle count which depends on the first event's duration; and
   a second TDC for determining a duration between (a) the first stop signal's indication of the end of the first event, and (b) a time referenced to the clock cycle count provided by the counter.

9. The apparatus of claim 8 wherein the maximum duration measured by the second TDC does not exceed a period of the clock cycles.

10. The apparatus of claim 8 wherein for each output node of the ring oscillator, at least one delay operable to be provided at the output node is shorter than a period of the clock cycles.

11. The apparatus of claim 8 wherein an oscillation period of the ring oscillator is shorter than a period of the clock cycles.

12. An apparatus comprising a circuit for measuring event durations, the circuit comprising:
   a ring oscillator comprising a plurality of serially connected buffers with equal propagation delays, each buffer having an output node;
   a plurality of time-to-digital converters (TDCs), each TDC being for determining a duration between assertions of signals on two input nodes of the TDC, one of the TDC's input nodes being connected to one of the output nodes but not to any other one of the output nodes.

13. The apparatus of claim 12 wherein for each TDC, one of the TDC's input nodes is connected to receive a respective stop signal indicating an end of an associated event, different TDCs being associated with different events.

14. The apparatus of claim 12 wherein the ring oscillator is connected to receive an input signal asserted at a start of each of a plurality of events.

15. The apparatus of claim 12 wherein the duration determined by at least one of the TDCs corresponds to a duration of travel of a light beam from a light emitter of the apparatus to a light detector of the apparatus.

16. The apparatus of claim 15 wherein the duration determined by said at least one of the TDCs is a duration from emitting the light beam to crossing a predefined threshold by a signal generated from light detected by the light detector.

17. An apparatus comprising a circuit for measuring event durations, the circuit comprising:
   a ring oscillator comprising a plurality of serially connected buffers with equal propagation delays, each buffer having an output node;
   a plurality of time-to-digital converters (TDCs), each TDC being for determining a duration between assertions of signals on two input nodes of the TDC, one of the TDC's input nodes being connected to one of the output nodes;

wherein the ring oscillator is connected to receive a first stop signal which indicates an end of a first event which is one of a plurality of events, and the circuit further comprises a first TDC for determining a duration of the first event.

18. A method for measuring a distance to an object, the method comprising:
   emitting a light beam towards the object;
   generating a start signal, and asserting the start signal to indicate a start time when the light beam is emitted to the object;
   detecting light which comprises light reflected by the object;
   generating a plurality of electrical stop signals corresponding to a plurality of thresholds associated with the detected light, each stop signal being asserted in response to an associated threshold being reached;
   providing the start signal or one of the stop signals to an input node of a ring oscillator, the ring oscillator comprising a plurality of output nodes, the ring oscillator providing, on each output node, one or more delayed signals each of which is delayed relative to the signal provided to the input node;
   for each stop signal not provided to the input node, generating a duration signal corresponding to a duration between an assertion of the stop signal and an assertion of an associated one of the delayed signals;
   wherein:
   the signal provided to the input node of the ring oscillator is a first stop signal which is one of the stop signals; and
   the method further comprises determining a duration between an assertion of the start signal and an assertion of the first stop signal.

19. The method of claim 18 wherein the duration between an assertion of the start signal and an assertion of the first stop signal is determined using a two-step TDC comprising a counter for counting a number of clock cycles and comprising a TDC for determining a duration between the assertion of the first signal and a time interval obtained using the counter.

* * * * *